(12) United States Patent
Takakura et al.

(10) Patent No.: US 7,109,049 B2
(45) Date of Patent: Sep. 19, 2006

(54) METHOD FOR FABRICATING A NITRIDE SEMICONDUCTOR LIGHT-EMITTING DEVICE

(75) Inventors: Teruyoshi Takakura, Tenri (JP);
Takeshi Kamikawa, Mihara (JP);
Yoshika Kaneko, Funabashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 70 days.

(21) Appl. No.: 11/060,381

(22) Filed: Feb. 17, 2005

(65) Prior Publication Data

US 2005/0186694 A1 Aug. 25, 2005

(30) Foreign Application Priority Data

Feb. 20, 2004 (JP) ............... 2004-044630

(51) Int. Cl.
*H01L 21/00* (2006.01)
(52) U.S. Cl. .............. 438/28; 438/33; 438/44
(58) Field of Classification Search ........... 438/22–47, 438/455–465, 478–509, 33
See application file for complete search history.

(56) References Cited

U.S. PATENT DOCUMENTS

| 6,316,785 | B1* | 11/2001 | Nunoue et al. .............. 257/14 |
| 6,815,726 | B1* | 11/2004 | Ishida et al. ............... 257/94 |
| 2001/0030329 | A1* | 10/2001 | Ueta et al. ................ 257/103 |
| 2002/0013036 | A1* | 1/2002 | Gehrke et al. .............. 438/462 |
| 2002/0056846 | A1* | 5/2002 | Tsuda et al. ................ 257/86 |
| 2004/0041156 | A1* | 3/2004 | Tsuda et al. ................ 257/79 |
| 2004/0113141 | A1* | 6/2004 | Isuda et al. ................ 257/13 |
| 2005/0042787 | A1* | 2/2005 | Ito et al. ................... 438/41 |
| 2005/0104162 | A1* | 5/2005 | Xu et al. ................. 257/627 |
| 2005/0141577 | A1* | 6/2005 | Ueta et al. ................. 372/43 |
| 2005/0151153 | A1* | 7/2005 | Kamikawa et al. ......... 257/103 |

FOREIGN PATENT DOCUMENTS

JP 2000-299497 10/2000

OTHER PUBLICATIONS

Zauner et al "Homo-epitaxial growth on misorineted GaN substrates by MOCVD", Mat.Res.Soc.Symp.vol. 595 2000 Material rearcg sosciety, ppW6.3.1-W6.3.5).*

* cited by examiner

*Primary Examiner*—Savitri Mulpuri
(74) *Attorney, Agent, or Firm*—Morrison & Foerster LLP

(57) ABSTRACT

Provided is a method for fabricating a nitride semiconductor light-emitting device including a nitride semiconductor substrate having a groove and a ridge formed on the top surface thereof so as to extend in the shape of stripes and a nitride semiconductor growth layer consisting of a plurality of nitride semiconductor layers laid on top of the nitride semiconductor substrate. The method involves a step of forming a 10 μm or more wide flat region above at least either of the groove and ridge by forming the nitride semiconductor growth layer on top of the nitride semiconductor substrate so that the height of the nitride semiconductor growth layer laid above the groove is smaller than the height of the nitride semiconductor growth layer laid above the ridge.

10 Claims, 8 Drawing Sheets

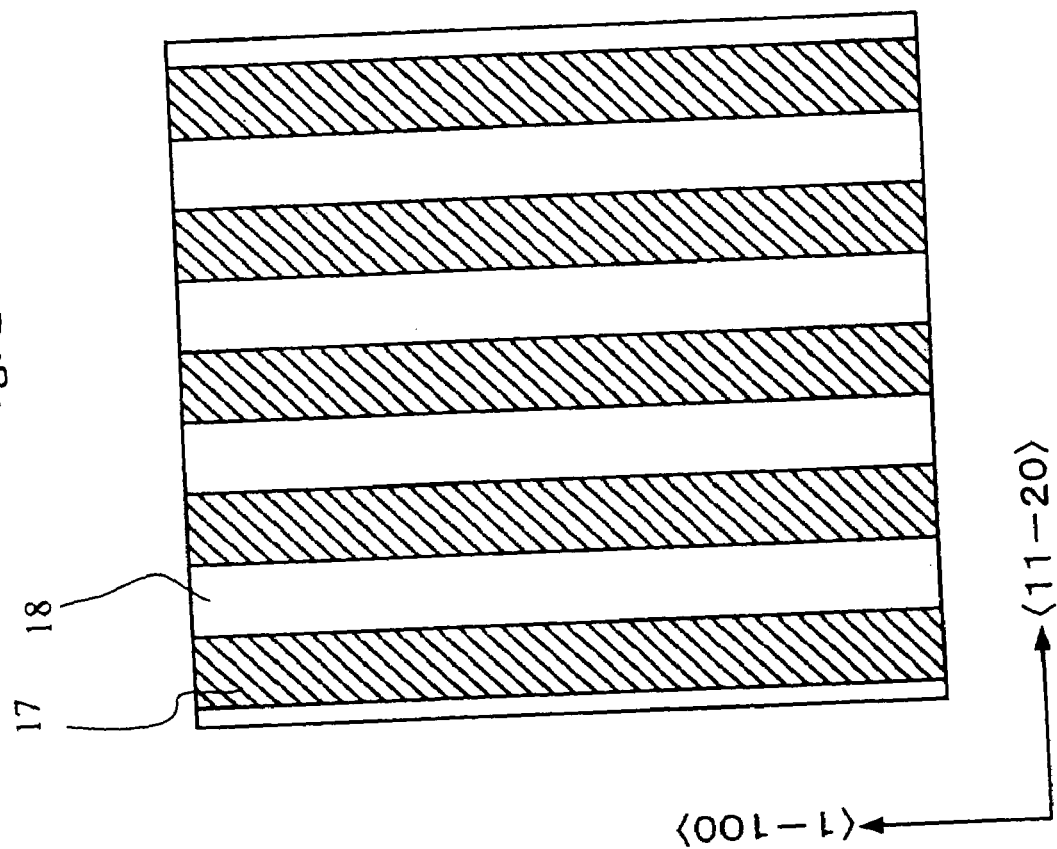

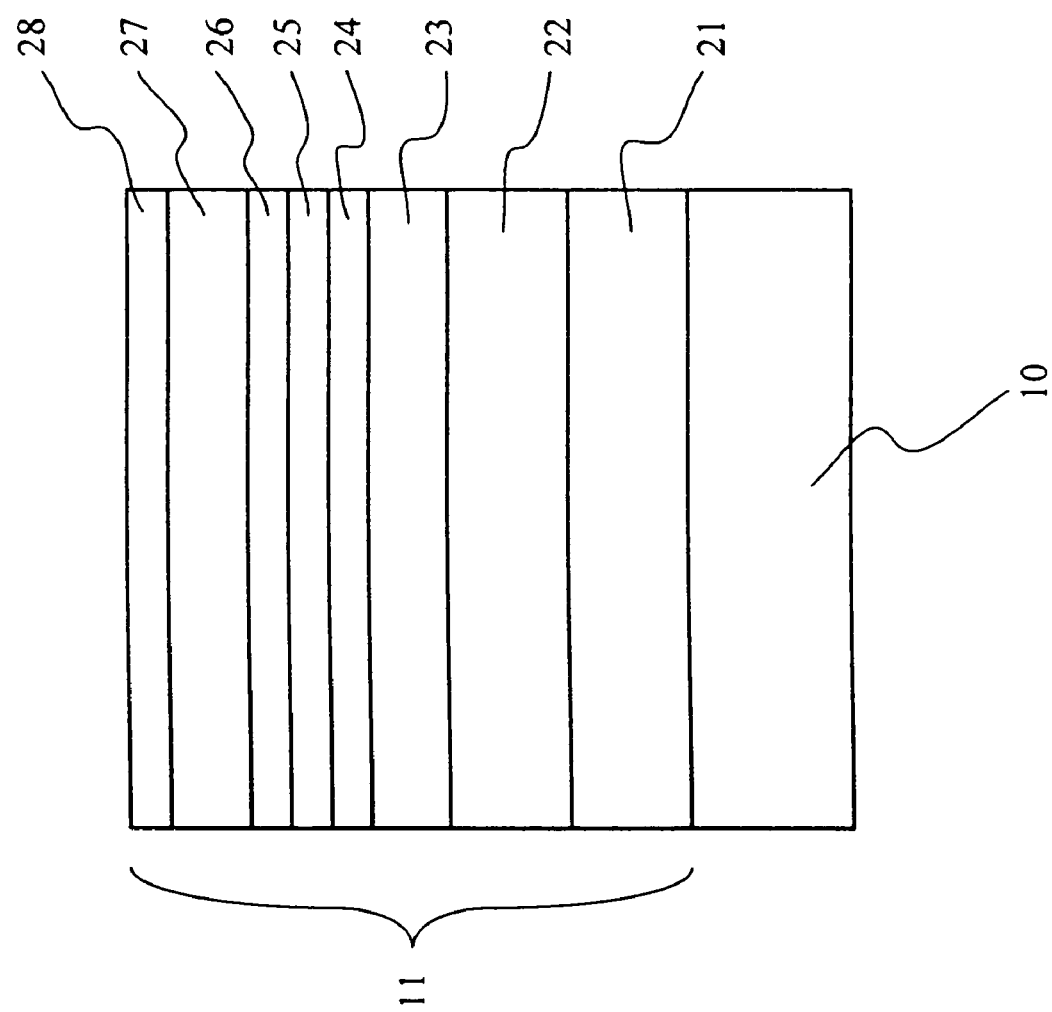

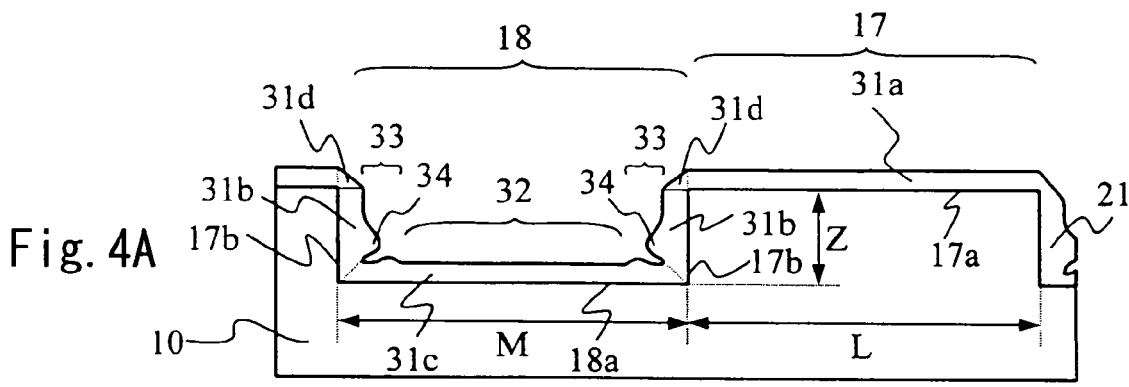
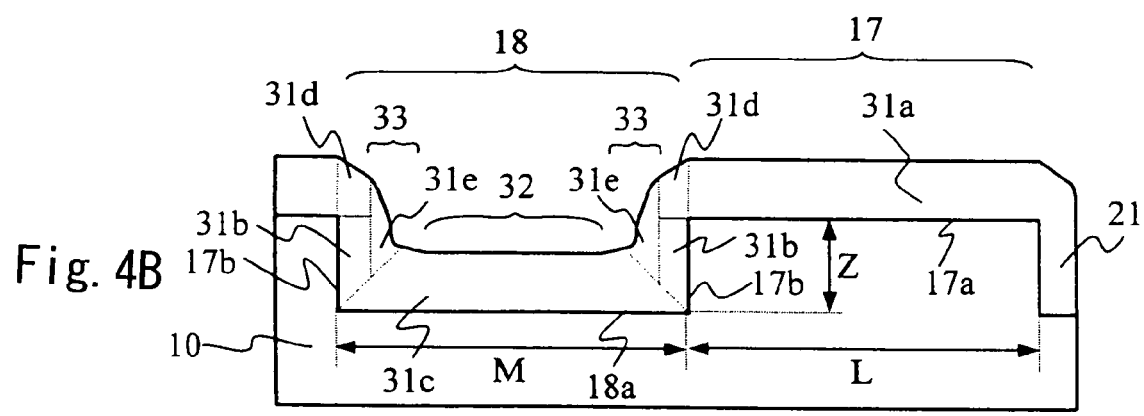
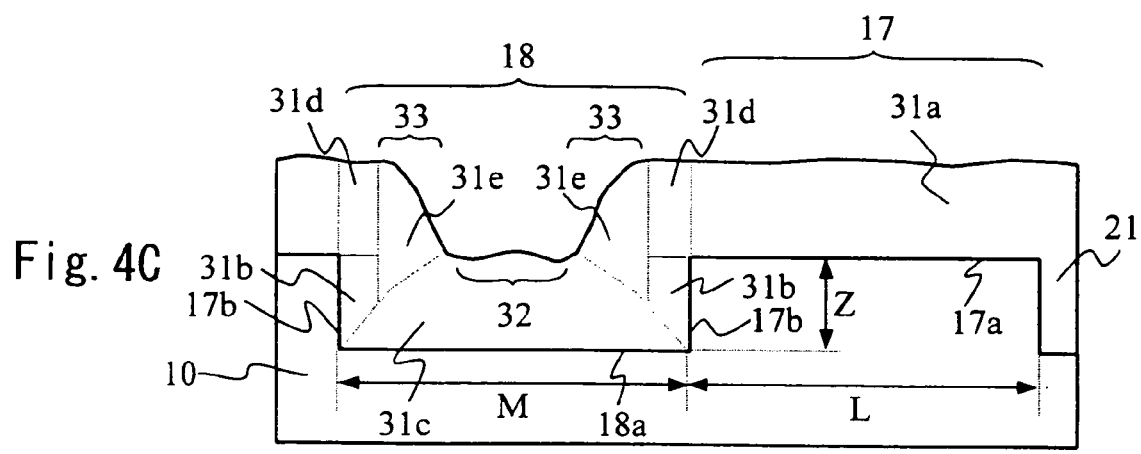

METHOD FOR FABRICATING A NITRIDE SEMICONDUCTOR LIGHT-EMITTING DEVICE

This nonprovisional application claims priority under 35 U.S.C. § 119(a) on Patent Application No. 2004-044630 filed in Japan on Feb. 20, 2004, the entire contents of which are hereby incorporated by reference.

BACKGROUND OF THE INVENTION

1. Field of the Invention

The present invention relates to a nitride semiconductor light-emitting device such as a nitride semiconductor laser device.

2. Description of Related Art

Nitride semiconductor laser devices that lase in an ultraviolet to visible region of the spectrum have been fabricated on a commercial basis as well as on a trial basis by the use of nitride semiconductor materials exemplified by GaN, AlN, InN, and mixed crystals thereof. For this purpose, GaN substrates are typically used, the use of which, however, has thus far never led to the production of nitride semiconductor laser devices with satisfactorily long lasing lives. Thus, longer lasing lives are sought after. The lasing lives of nitride semiconductor laser devices are affected by cracks and the like that develop when nitride semiconductor layers are laid on top of a GaN substrate. Thus, the development of cracks is one of the factors that cause the deterioration of nitride semiconductor laser devices, and therefore needs to be minimized.

According to one conventionally proposed technique against the above problem, a nitride semiconductor device is fabricated by growing on top of a GaN substrate a nitride semiconductor having a lower thermal expansion coefficient than GaN and then forming further on top thereof a semiconductor light-emitting device structure. This helps reduce the development of minute cracks in particular in the n-type contact layer formed on top of the GaN substrate (see Japanese Patent Application Laid-Open No. 2000-299497, hereinafter referred to as Patent Publication 1).

However, even when a semiconductor laser device structure is laid on top of a GaN substrate according to the technique proposed by Patent Publication 1 mentioned above, cracks do sometimes develop on the surface of the wafer. These cracks that have developed on the surface become one of the factors that cause the deterioration of the characteristics of semiconductor laser devices, leading to unduly short lasing lives, and to lower yields as result from chips being divided in an unexpected manner due to clefts developing along cracks.

SUMMARY OF THE INVENTION

In view of the conventionally experienced problems mentioned above, it is an object of the present invention to provide a method for fabricating a nitride light-emitting device whereby, when the nitride light-emitting device is fabricated by laying a nitride semiconductor growth layer on top of a nitride semiconductor substrate, the nitride semiconductor growth layer can be formed with less cracks and with better surface flatness.

To achieve the above object, according to the present invention, a method for fabricating a nitride semiconductor light-emitting device including a nitride semiconductor substrate having a groove and a ridge formed on the top surface thereof so as to extend in the shape of stripes and a nitride semiconductor growth layer having a plurality of nitride semiconductor layers laid on top of the nitride semiconductor substrate involves: a first step of forming a 10 μm or more wide flat region above at least either of the groove and ridge by forming the nitride semiconductor growth layer on top of the nitride semiconductor substrate so that the height of the nitride semiconductor growth layer laid above the groove is smaller than the height of the nitride semiconductor growth layer laid above the ridge; a second step of forming an elevated ridge stripe portion on the surface of the nitride semiconductor growth layer in the flat region formed in the first step; and a third step of performing division along at least either of the groove and ridge along a division line extending in a direction parallel to the ridge stripe portion.

According to the present invention, the cross-sectional shape of the groove may rectangular, or inverted-tapered so that the width of the groove at the opening thereof is smaller than the width of the groove at the floor thereof, or regular-tapered so that the width of the groove at the opening thereof is greater than the width of the groove at the floor thereof.

In the above-described method for fabricating a nitride semiconductor light-emitting device, the width of the groove formed on the nitride semiconductor substrate may be 50 μm or more but 1,200 μm or less.

In the above-described method for fabricating a nitride semiconductor light-emitting device, the depth of the groove formed on the nitride semiconductor substrate may be 3 μm or more but 20 μm or less.

In the above-described method for fabricating a nitride semiconductor light-emitting device, the layer thickness of an n-type GaN layer laid on the surface of the nitride semiconductor substrate may be 0.1 μm or more but 2 μm or less.

In the above-described method for fabricating a nitride semiconductor light-emitting device, the off angle of the top surface of the nitride semiconductor substrate may be 0.2° or less.

In the above-described method for fabricating a nitride semiconductor light-emitting device, the width of the ridge may be 70 μm or more but 1,200 μm or less.

In the above-described method for fabricating a nitride semiconductor light-emitting device, the ridge stripe portion may be formed in the flat region, 5 μm or more away from the edge of the flat region.

In the above-described method for fabricating a nitride semiconductor light-emitting device, in the third step, the division line may be at least 20 μm away from the ridge stripe portion.

In the above-described method for fabricating a nitride semiconductor light-emitting device, in the third step, the nitride semiconductor light-emitting device formed above the groove or ridge may be divided along the division line so that the nitride semiconductor light-emitting device thus divided does not include the stepped portion formed between the groove and the ridge.

In the above-described method for fabricating a nitride semiconductor light-emitting device, in the third step, the nitride semiconductor light-emitting device formed above the groove or ridge may be divided along the division line so that the nitride semiconductor light-emitting device thus divided includes the stepped portion formed between the groove and the ridge.

In the above-described method for fabricating a nitride semiconductor light-emitting device, when the nitride semiconductor light-emitting device is formed above both the groove and ridge, the nitride semiconductor light-emitting device formed above the groove and ridge may be divided so that one of the nitride semiconductor light-emitting devices thus divided includes the stepped portion formed between the groove and the ridge.

BRIEF DESCRIPTION OF THE DRAWINGS

FIG. 2 is a top view of an n-type GaN substrate as observed before a nitride semiconductor growth layer is laid on top thereof in the first embodiment of the invention;

FIG. 3 is a schematic sectional view showing the structure of the nitride semiconductor growth layer as observed in the first, a second, and a third embodiment of the invention;

FIGS. 4A to 4C are diagrams showing how creep-up growth progresses;

DETAILED DESCRIPTION OF PREFERRED EMBODIMENTS

First, the definitions of some terms frequently used in the present specification will be given. A "nitride semiconductor substrate" denotes any substrate formed of a nitride semiconductor, and is therefore interchangeable with a "substrate of $Al_aGa_bIn_cN$" (where $0 \leq a \leq 1$, $0 \leq b \leq 1$, $0 \leq c \leq 1$, and $a+b+c=1$). In such a substrate of $Al_aGa_bIn_cN$ (where $0 \leq a \leq 1$, $0 \leq b \leq 1$, $0 \leq c \leq 1$, and $a+b+c=1$), about 10% or less of the nitrogen contained therein (so long as it has a hexagonal system) may be replaced with As, P, or Sb. In the present specification, any such substrate is collectively referred to as a "GaN substrate."

In the present specification, a "groove" denotes a depressed portion formed in the shape of a stripe on the top surface (growth surface) of a nitride semiconductor substrate. Likewise, a "ridge" denotes an elevated portion formed in the shape of a stripe on that surface. The cross-sectional shape of such a ridge or groove does not necessarily have to be rectangular, but may be, for example, regular-tapered or inverted-tapered. When a groove is formed, surfaces appear that are simultaneously the side surfaces of the groove and of the adjacent ridges. Since these surfaces are identical, in the present specification, all such surfaces are referred to as "ridge side surfaces."

In the present specification, an "active layer" collectively denotes any layer consisting of a single well layer or consisting of one or more well layers and barrier layers. For example, an active layer having a single quantum well structure consists solely of a single well layer, or consists of a combination of a barrier layer, a well layer, and a barrier layer. On the other hand, an active layer having a multiple quantum well structure consists of a plurality of well layers and a plurality of barrier layers.

In the present specification, an "off angle" denotes the angle of the surface of a GaN substrate cut out of or otherwise obtained from monocrystalline GaN relative to the C plane, also called the (0001) plane, which is the crystal growth plane of monocrystalline GaN.

In crystallography, it is customary to place an overscore above the absolute value of an index indicating a plane or orientation of a crystal if the index is negative. In the present specification, since such notation is impossible, a negative index is indicated by a minus sign "−" preceding the absolute value of the index.

First Embodiment

Figure 1:
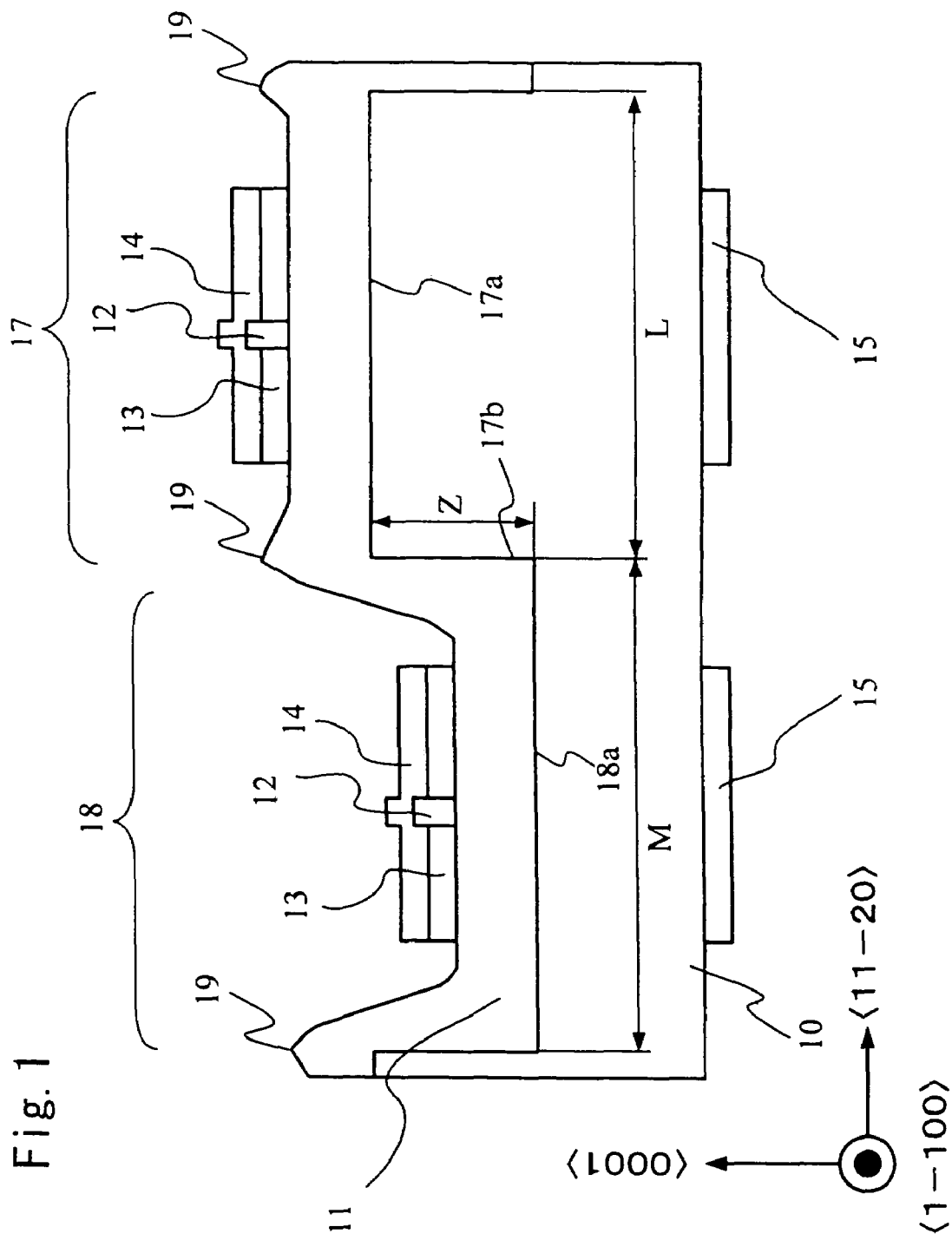
FIG. 1 is a schematic sectional view showing part of a wafer on which the nitride semiconductor laser device of a first embodiment of the invention is formed.

A first embodiment of the present invention will be described below with reference to the relevant drawings. The following description deals with, as an example of a nitride light-emitting device, a nitride semiconductor laser device. FIG. 1 is a schematic sectional view showing part of a wafer on which the nitride semiconductor laser device of this embodiment is formed. FIG. 2 is a top view of an n-type GaN substrate 10 as observed before a nitride semiconductor growth layer 11 is laid on top thereof in this embodiment. In these figures, plane orientations are indicated together. The nitride semiconductor laser device shown in FIG. 1 is produced by laying or otherwise forming a nitride semiconductor growth layer 11 on top of the n-type GaN substrate 10 shown in FIG. 2.

As shown in FIG. 2, on the n-type GaN substrate 10, ridges 17 and grooves 18 are formed in a direction parallel to the <1-100> direction. Here, the ridges and grooves are assumed to have a rectangular cross-sectional shape. FIG. 3 is a schematic sectional view showing the structure of the nitride semiconductor growth layer 11.

In this nitride semiconductor laser device, how the n-type GaN substrate 10 is produced is as described below with reference to the relevant drawings. The principal plane orientation of the top surface of the n-type GaN substrate 10 is the (1000) plane, and the n-type GaN substrate 10 has an off angle of 0.1° (not illustrated) relative to the principal plane orientation. On the top surface of this n-type GaN substrate 10, $SiO_2$, $SiN_x$, or the like is vapor-deposited. In this embodiment, the use of $SiO_2$ is assumed; however, any other type of dielectric film or the like may be used instead. Next, to this $SiO_2$ film, a resist material is applied so that, by the common lithography technique, a resist mask pattern in the shape of stripes is formed in the <1-100> direction. Next, by the RIE (reactive ion etching) technique or the like, the $SiO_2$ and the top surface of the n-type GaN substrate 10 are etched to form grooves 18. Thereafter, with an etchant such as HF (hydrofluoric acid), the $SiO_2$ is removed. In this way, the n-type GaN substrate 10 having ridges 17 and grooves 18 formed in the <1-100> direction as shown in FIG. 2 is produced. In this embodiment, the RIE technique is used to etch the top surface of the n-type GaN substrate 10 to form the grooves 18; however, any other technique such as the wet etching technique may be used instead.

The ridges 17 and grooves 18 formed as described above are formed parallel to the <1-100> direction on the top surface of the n-type GaN substrate 10. The width M of the grooves is 500 µm, the width L of the ridges is 500 µm, and the depth Z (see FIG. 1) of the grooves is 5 µm. The cross-sectional shape of the ridges 17 and grooves 18 may be rectangular, or regular-tapered so that the width of the grooves 18 at the opening thereof is greater than the width at the floor thereof, or inverted-tapered so that the width of the grooves 18 at the opening thereof is smaller than the width at the floor thereof.

The depth Z of the grooves 18 affects how readily the grooves 18 are filled as the nitride semiconductor growth layer 11 is formed. Thus, if the n-type GaN substrate 10 is produced with the depth of the grooves 18 less than 3 µm, when the nitride semiconductor growth layer 11 is laid on top of the n-type GaN substrate 10, creep-up growth, of which a description will be given later, causes the grooves 18 to be filled over a large area. Disadvantageously, this not only makes it impossible to secure regions in which to form ridge stripe portions but also lowers the surface flatness of the nitride semiconductor growth layer 11. On the other hand, if the depth Z of the grooves 18 is more than 20 µm, disadvantageously, the development of cracks and other problems are likely in the fabrication process of the nitride semiconductor laser device. Hence, it is preferable that the depth Z of the grooves 18 be 3 µm or more but 20 µm or less, and it is further preferable that it be 5 µm or more but 10 µm or less.

It is preferable that the off angle of the n-type GaN substrate 10 on which the ridges 17 and grooves 18 are formed be 0.2° or less relative to the principal plane. If the nitride semiconductor growth layer 11 is laid on a GaN substrate having an off angle greater than 0.2°, disadvantageously, the top surface of the ridges 17 and the middle portion of the grooves 18 may incline in a particular direction, or wavelike irregularities develop over the entire surface of the nitride semiconductor growth layer 11, leading to lower flatness over the entire surface of the wafer.

On the substrate produced through the above-described processes, the nitride semiconductor growth layer 11 shown in FIG. 3 is epitaxially grown by the MOCVD (metalorganic chemical vapor deposition) method or the like. In this way, the nitride semiconductor laser device shown in FIG. 1 is produced.

As shown in FIG. 3, the nitride semiconductor growth layer 11 has, on the surface of the n-type GaN substrate 10, the following layers laid on top of one another in the order in which they are enumerated: a 1 µm thick n-type GaN layer 21; a 1.2 µm thick n-type $Al_{0.1}Ga_{0.9}N$ clad layer 22; a 0.1 µm thick n-type GaN light guide layer 23; a multiple quantum well structure active layer 24 consisting of four 8 nm thick $In_{0.01}Ga_{0.99}N$ barrier layers and three 4 nm thick $In_{0.1}Ga_{0.9}N$ well layers; a 20 nm thick p-type $Al_{0.3}Ga_{0.7}N$ carrier block layer 25; a 0.1 µm thick p-type GaN light guide layer 26; a 0.5 µM thick p-type $Al_{0.1}Ga_{0.9}N$ clad layer 27; and a 0.1 µm thick p-type GaN contact layer 28.

Next, how the nitride semiconductor growth layer 11 is produced will be described. The following description deals with a case in which the MOCVD method is used; however, any growth method other than the MOCVD method may be used so long as it permits epitaxial growth, examples of usable growth methods including other vapor phase growth methods such as the MBE (molecular beam epitaxy) method and the HDVPE (hydride vapor phase epitaxy) method.

The n-type GaN substrate 10 is placed on a predetermined susceptor inside the growth furnace of MOCVD equipment. The susceptor temperature is then raised up to 1,050° C. Then, while $H_2$ or $N_2$ is used as a carrier gas, $NH_3$ as the raw material for N, TMGa (trimethylgallium) or TEGa (triethylgallium) as the raw material for Ga, and $SiH_4$ as the raw material for Si used an n-type impurity (dopant) are supplied into the growth furnace to grow the n-type GaN layer 21. Thereafter, TMAL (trimethylaluminum) or TEAl (tryethylaluminum) as the raw material for Al is supplied into the growth furnace to grow the n-type $Al_{0.1}Ga_{0.9}N$ clad layer 22. In the films thus far mentioned, the concentration of Si used an n-type impurity (dopant) is so controlled as to be in the range from $5 \times 10^{17}/cm^3$ to $1 \times 10^{19}/cm^3$. Subsequently, the n-type GaN light guide layer 23 is grown so that the Si concentration in the film is so controlled as to be in the range from $1 \times 10^{16}/cm^3$ to $1 \times 10^{18}/cm^3$.

Thereafter, the susceptor temperature is lowered down to 750° C., and the multiple quantum well structure active layer 24 is grown, which consists of three periods of $In_{0.1}Ga_{0.9}N$ well layers and four periods of $In_{0.01}Ga_{0.99}N$ barrier layers. This multiple quantum well structure active layer 24 is formed by laying the constituent layers thereof in the following order: a barrier layer, a well layer, a barrier layer, a well layer, a barrier layer, a well layer, and a barrier layer. When this multiple quantum well structure active layer 24 is formed, $SiH_4$ is supplied into the growth furnace so that the Si concentration in the barrier layers, or both in the barrier and well layers, is in the range from $1 \times 10^{16}/cm^3$ to $1 \times 10^{18}/cm^3$.

Next, the susceptor temperature is raised back to 1,050° C., then the supply of $SiH_4$ is stopped, and then $NH_3$ as the raw material for N, TMGa (trimethylgallium) or TEGa (triethylgallium) as the raw material for Ga, and TMAl (trimethylaluminum) or TEAl (tryethylaluminum) as the raw material for Al are supplied into the growth furnace to form, one after another, the p-type $Al_{0.3}Ga_{0.7}N$ carrier block layer 25, the p-type GaN light guide layer 26, the p-type $Al_{0.1}Ga_{0.9}N$ clad layer 27, and the p-type GaN contact layer 28. When these films are formed, as the raw material of Mg used as a p-type impurity (dopant), $EtCP_2Mg$ (bisethylcyclopentadienylmagnesium) is supplied into the furnace so that the Mg concentration in the films are so controlled as to be in the range from $1 \times 10^{18}/cm^3$ to $2 \times 10^{20}/cm^3$. Here, as the raw material for Mg, any other cyclopenta-based Mg material may be used, such as cyclopentadienylmagnesium or bismethylcyclopentadienylmagnesium. The residual hydrogen in the p-type layers, such as the p-type $Al_{0.3}Ga_{0.7}N$ carrier block layer 25, the p-type GaN light guide layer 26, the p-type $Al_{0.1}Ga^{0.9}N$ clad layer 27, and the p-type GaN contact layer 28, hinders the activation of Mg used as a p-type dopant. To eliminate the residual hydrogen, a trace amount of oxygen may be mixed while the p-type layers are grown.

After the p-type GaN contact layer 28 is grown in this way, all the gas present in the MOCVD equipment is replaced with $N_2$ and $NH_3$, and the susceptor temperature is lowered at a rate of 60° C./min. When the susceptor temperature reaches 800° C., the supply of $NH_3$ is stopped, and then the susceptor temperature is kept at 800° C. for five minutes. Thereafter, the susceptor temperature is lowered down to room temperature. In this embodiment, the susceptor temperature is kept at 800° C. for five minutes; however, it may be kept at any other temperature for any other length of time. It is preferable that the susceptor temperature at which to keep it be in the range from 650° C. to 900° C., and that the length of time for which to keep it be in the range from 3 to 10 minutes. It is preferable that the rate at which to lower the susceptor temperature be 30° C./min or more.

The nitride semiconductor growth layer 11 produced as described above was evaluated by Raman measurement, with the following results. After the wafer was taken out of the MOCVD equipment, even before p-typifying annealing was performed, Mg had already been activated to achieve certain p-typification. Moreover, the contact resistance after the formation of a p-electrode was reduced. These results show that, advantageously, performing p-typifying annealing as conventionally practiced helps further increase the Mg activation ratio.

When the multiple quantum well structure active layer 24 is grown, it is advisable to suspend film formation for 1 second or more but 180 seconds or less after the growth of a barrier layer before the growth of a well layer and after the growth of a well layer before the growth of a barrier layer. This helps enhance the flatness of the individual barrier and well layers. Better flatness makes uniform the In composition and the layer thickness of the individual barrier and well layers, and thus helps reduce the unevenness of the lasing wavelength. Advantageously, this reduces the FWHM (full width at half maximum) of the spontaneously (naturally) emitted light.

To the multiple quantum well structure active layer 24, As may be added by supplying AsH$_3$(arsine), TBAs(tertiarybutylarsine), or TMAs(trimethylarsine); P may be added by supplying PH$_3$(phosphine), TBP(tertiarybutylphosphine), or TMP(trimethylphosphine); Sb may be added by supplying TMSb(trimethylantimony) or TESb(triethylantimony). When the multiple quantum well structure active layer 24 is formed, as the raw material for N, any other material than NH$_3$ may be used, such as a hydrazine material like dimethylhydrazine or an azide material like ethylazide.

In a case where, as in this embodiment, the active layer is formed as a multiple-layered In$_x$Ga$_{1-x}$N quantum well, or As or P is added to the active layer to form a quantum well structure active layer, if a penetrating dislocation (or a through dislocation) is present in the quantum well layer, disadvantageously, In segregates at the dislocation. Thus, in a case where the active layer is formed as a quantum well layer using In$_x$Ga$_{1-x}$N as described above, it is preferable to minimize crystal defects, such as dislocations, in the quantum well layer as much as possible to obtain good nitride semiconductor laser characteristics.

In this embodiment, the multiple quantum well structure active layer 24 starts with a barrier layer and ends with a barrier layer; however, it may start with a well layer and ends with a well layer. The number of well layers formed is not limited to three; any number of well layers may be formed so long as the number does not exceed 10, because they then offer a low threshold current density and permits continuous lasing at room temperature. It is particularly preferable that the number of well layers formed be two or more but six or less, because they then offer a low threshold current density. The multiple quantum well structure active layer 24 may contain Al.

In this embodiment, the multiple quantum well structure active layer 24 has Si added as an impurity to both the well and barrier layers; however, these layers do not necessarily have to contain any impurity. The impurity added is not limited to Si, but may be O, C, Ge, Zn, or Mg. It is preferable that the total amount of impurities added be roughly in the range from $1 \times 10^{17}$ to $8 \times 10^{18}$/cm$^3$. The impurity does not necessarily have to be added to both the well and barrier layers, but may be added to only the well or barrier layers.

In this way, on the surface of the n-type GaN substrate 10 produced through the processes described earlier, the nitride semiconductor growth layer 11 starting with the n-type GaN layer 21 is laid so as to have good flatness, achieving the fabrication of a nitride semiconductor laser device without cracks. Here, creep-up growth is exploited, which is greatly affected by factors such as the value of the depth Z of the grooves 18 and the design layer thickness of the n-type GaN layer 21. Now, a description will be given of creep-up growth.

When the nitride semiconductor layers that together form the nitride semiconductor growth layer 11 is laid on top of the n-type GaN substrate 10 having the grooves 18 and ridges 17 formed thereon, there appear regions where the thickness of the nitride semiconductor layers that have grown near the edges of the grooves 18 is greater than the thickness of the nitride semiconductor layers that have grown approximately in the <11-20> direction (hereinafter "horizontally") from the side surfaces 17b (see FIG. 1) of the ridges and the thickness of the nitride semiconductor layers that have grown approximately in the <0001> direction (hereinafter "vertically") from the floor surfaces 18a (see FIG. 1) of the grooves. As the nitride semiconductor layers further grow, since the vertical growth speed of the nitride semiconductor layers that have grown near the edges of the grooves 18 is greater than the growth speed elsewhere, the growth layer in the regions near the edges of the grooves 18 reaches the thickness of the nitride semiconductor layers that have grown vertically from the top surfaces 17a (see FIG. 1) of the ridges, with the result that the grooves 18 start to be filled.

How the nitride semiconductor layers grow in the regions near the edges of the grooves 18 is as if they, starting from the floor surfaces of the grooves 18, creep up the side surfaces of the ridges 17. This is why this phenomenon is called "creep-up growth" in the present specification. The regions in which creep-up growth occurs are called "creep-up growth regions," and the portions formed by creep-up growth are called "creep-up growth portions." Moreover, in the present specification, the grooves are described as being "filled" when the height of the surface of the nitride semiconductor layers that have grown above the floor surfaces 18a of the grooves becomes largely equal to the height of the surface of the nitride semiconductor layers that have grown above the top surfaces 17a of the ridges.

Now, how film formation progresses as observed when the nitride semiconductor layers are grown, through regular growth as well as through creep-up growth as described above, on top of the n-type GaN substrate 10 will be described with reference to the relevant figures. FIGS. 4A to 4C are diagrams showing the cross-sectional shape of part of the wafer as observed when the n-type GaN layer 21 is formed, with different thicknesses, on top of the n-type GaN substrate 10 having the grooves 18 and ridges 17 formed thereon.

In FIGS. 4A to 4C, the n-type GaN substrate 10 has the ridges 17, with a width L of 300 μm, and the grooves 18, with a width M of 100 μm and a depth Z of 5 μm, formed in a direction parallel to the <1-100> direction. FIG. 4A is a diagram showing the cross-sectional shape of part of the wafer as observed when the n-type GaN layer 21 is grown with a design layer thickness of 0.2 μm on top of the n-type GaN substrate 10. The n-type GaN layer 21 grows on the top surfaces 17a of the ridges, on the side surfaces 17b of the ridges, and on the floor surfaces 18a of the grooves to form top-surface growth portions 31a, side-surface growth portions 31b, and floor-surface growth portions 31c, respectively. Here, the regions sandwiched between the top-surface growth portions 31a and the side-surface growth portions 31b are called growth portions 31d.

In the top-surface growth portions 31a, and in the middle portions 32 of the grooves in the floor-surface growth portions 31c, the n-type GaN layer 21 grows to be approximately 0.2 μm thick. In the side-surface growth portions 31b near the growth portions 31d, the n-type GaN layer 21 grows toward the center of the grooves 18 to be approximately 0.3 μm thick. In the side-surface growth portions 31b near the floor surfaces 18a of the grooves, the n-type GaN layer 21 grows from the side surfaces 17b of the ridges so as to project therefrom, forming projecting portions 34. In the creep-up regions 33 where the projecting portions 34 are formed, creep-up growth is in early stages. Hence, the floor-surface growth portions 31c that have grown vertically from the floor surfaces 18a of the grooves have not yet joined the projecting portions 34 in the side surfaces 17b of the ridges.

FIG. 4B is a diagram showing the cross-sectional shape of part of the wafer as observed when the n-type GaN layer 21 is grown with a design layer thickness of 2 μm on top of the n-type GaN substrate 10. The projecting portions 34, shown in FIG. 4A, formed in the side-surface growth portions 31b near the floor surfaces 18a of the grooves have joined the floor-surface growth portions 31c that have grown vertically from the floor surfaces 18a of the grooves. This has caused creep-up growth, forming creep-up growth portions 31e. However, the vertical thickness of the creep-up growth portions 31e formed in the creep-up regions 33 has not yet reached the thickness of the top-surface growth portions 31a that have grown in the top surfaces 17a of the ridges, and thus have an inclined shape. The creep-up regions 33 extend toward the center of the grooves 18, forming sufficiently wide flat regions in the middle portions 32 of the grooves.

As described above, the floor-surface growth portions 31c that grow vertically from the floor surfaces 18a of the grooves and the side-surface growth portions 31b that grow horizontally from the side surfaces 17b of the ridges join together at the edges of the grooves 18, and this promotes creep-up growth. As creep-up growth further progresses, the n-type GaN layer 21 that has grown in the creep-up growth portions 31e formed in the creep-up regions 33 reaches the height of the surface of the top-surface growth portions 31a formed by the n-type GaN layer 21 that has grown in the top surfaces 17a of the ridges. As growth further progresses, in the grooves 18, in regions therein that have not been filled, the filling of the grooves 18 progresses under the influence of both the vertical film growth from the floor surfaces 18a of the grooves and the horizontal film growth from the creep-up growth portions 31e.

FIG. 4C is a diagram showing the cross-sectional shape of part of the wafer as observed when the n-type GaN layer 21 is grown with a design layer thickness of 5 μm on top of the n-type GaN substrate 10. Here, the n-type GaN layer 21 shown in FIG. 4C undergoes creep-up growth, making the creep-up growth portions 31e horizontally thicker. This widens the creep-up regions 33, with the result that the grooves 18 are filled except in the approximately 20 μm wide middle portions 32 thereof. Thus, it is impossible to secure flat regions in the middle portions 32 of the grooves. Moreover, the flatness at the surface of the top-surface growth portions 31a has deteriorated. This is because the widened creep-up regions 33 have made it impossible to sufficiently alleviate the strains within the n-type GaN layer 21. If a nitride semiconductor laser device is produced by further laying the nitride semiconductor growth layer 11 above the top-surface growth portions 31a, cracks are very likely to develop, and poor flatness will result. Thus, it is impossible to produce a highly reliable nitride semiconductor laser device.

What these figures show is as follows. As described previously, creep-up growth is related to the layer thickness of the n-type GaN layer 21 grown on top of the n-type GaN substrate 10. Creep-up growth occurs most notably when GaN is grown, and thus, if the layer thickness of the n-type GaN layer 21 is too great, creep-up growth progresses, resulting in lower flatness. Hence, a layer thickness more than 2 μm is undesirable here. On the other hand, if a nitride semiconductor laser device is produced by growing the n-type $Al_{0.1}Ga_{0.9}N$ clad layer 22 directly on the n-type substrate without growing the n-type GaN layer 21 in between, the nitride semiconductor growth layer 11 is influenced by the n-type GaN substrate 10, resulting in degraded crystallinity. Hence, it is preferable that the n-type GaN layer 21 be grown to be 0.1 μm or more thick. Thus, it is preferable that the n-type GaN layer 21 be 0.1 μm or more but 2 μm or less thick. Furthermore, it is preferable that the growth of the n-type GaN layer 21 be completed before the floor-surface growth portions 31c formed by the n-type GaN layer 21 growing vertically from the floor surfaces 18a of the grooves join the side-surface growth portions 31b formed by the n-type GaN layer 21 growing horizontally from the side surfaces 17b of the ridges. Incidentally, creep-up growth has been found to be less likely to occur with AlGaN or InGaN.

If the grooves 18 are insufficiently wide, they are filled up through creep-up growth, making it impossible to secure flat regions in the middle portions 32 of the grooves. Hence, it is preferable that the grooves 18 be 50 μm or more wide. On the other hand, making the grooves 18 wide prevents them from being completely filled, but makes it impossible to sufficiently alleviate the strains occurring in the nitride semiconductor growth layer 11, making cracks more likely to develop and resulting in lower flatness. Hence, it is preferable that the grooves 18 be 1,200 μm or less wide.

It has been found that, on the surface of the nitride semiconductor growth layer 11 formed by laying the n-type GaN layer 21 and other layers on top of the n-type GaN substrate 10 in the manner described above, near the edges of the ridges 17, there appear edge growths 19 (see FIG. 1), which are film projections 20 μm to 30 μm wide and roughly 0.3 μm high. These edge growths 19, while hardly occurring when the n-type layer among those constituting the nitride semiconductor growth layer 11 are grown, occur notably when the p-type layers are grown.

Hardly any edge growths 19 occur, however, on a wafer on which creep-up growth has so progressed that the grooves 18 are filled to a large extent as shown in FIG. 4C. Under conditions where hardly any edge growths 19 occur, however, the flatness of the top surface of the nitride semiconductor growth layer 11 laid on the surface of the ridges 17 and grooves 18 tends to be extremely poor. By contrast, under conditions where edge growths 19 occur, except in the regions where the edge growths 19 have occurred, the flatness of the top surface of the nitride semiconductor growth layer 11 laid on the surface of the ridges 17 is good. These flat regions on the surface of the ridges 17 need to be at least so wide as to permit ridge stripe portions to be formed therein. Thus, to permit ridge stripe portions to be formed elsewhere than in the regions where the edge growths 19 occur, i.e., the regions covering a width of 20 to 30 μm from the edges of the ridges 17, it is preferable that the ridges 17 be 70 μm or more wide. Giving the ridges 17 an unduly great width L makes cracks likely to develop, and hence it is preferable that the width be 1,200 μm or less.

Through the processes described above according to the present invention, it is possible to lay a nitride semiconductor growth layer 11 as shown in FIG. 3 on top of an n-type GaN substrate 10 having grooves 18 and ridges 17 formed thereon, and this can be achieved without developing cracks over the entire wafer and while securing flat regions, 400 μm wide at the ridges 17 and 400 μm wide at the grooves 18. In the flat regions thus secured, the nitride semiconductor laser device shown in FIG. 1 is produced.

The nitride semiconductor laser device shown in FIG. 1 thus has, through the processes described above, a nitride semiconductor growth layer 11 as shown in FIG. 3 laid on top of an n-type GaN substrate 10 having grooves 18 and ridges 17 formed thereon. Moreover, on the surface of the nitride semiconductor growth layer 11, there are formed ridge stripe portions 12 that function as laser light waveguides and $SiO_2$ layers 13 that are so arranged as to lie between the stripe portions 12 and that function as insulating films for current constriction. In addition, p-electrodes 14 are formed each on the surface of a ridge stripe portion 12 and of the contiguous $SiO_2$ layer 13, and n-electrodes 15 are formed on the bottom surface of the n-type GaN substrate 10.

There are no particular restrictions on where to form the ridge stripe portions 12 except that they should be formed in flat regions on the surface of the ridges 17 and grooves 18; it is further preferable that they be located 5 μm or more away from the edges of the flat regions. In this embodiment, the ridge stripe portions 12 are formed on the top surface of the nitride semiconductor growth layer 11 laid on the surface of the ridges 17 and grooves 18, near the center of flat regions secured thereon 250 μm away from the side surfaces 17b of the ridges on both sides.

The ridge stripe portions 12 are formed in the following manner. By the photolithography technique and the dry etching technique as commonly practiced, part of the nitride semiconductor growth layer 11 is etched, from the topmost surface thereof (the p-type GaN contact layer 28) down to halfway into the p-type $Al_{0.1}Ga_{0.9}N$ clad layer 27 so as to leave a strip-shaped pattern, which forms ridge stripe portions 12. The width of the stripes is 1 μm to 3 μm, and preferably 1.3 μm to 2 μm. The distance from the interface between the p-type GaN light guide layer 26 and the p-type $Al_{0.1}Ga_{0.9}N$ clad layer 27 to the etched floor surface is 0.1 μm to 0.4 μm.

Subsequently, elsewhere than in the ridge stripe portions 12, $SiO_2$ layers 13 are formed that function as insulating films for current constriction. Here, the stripe-shaped p-type GaN contact layer 28 that has been left unetched is exposed, and, on these exposed parts thereof and on the $SiO_2$ layers 13, Pd/Mo/Au are vapor-deposited in this order to form p-electrodes 14.

In this embodiment, as described above, $SiO_2$ is used to form insulating films; however, they may be formed of any other material, examples of such materials including oxides and nitrides of silicon, titanium, zirconium, tantalum, aluminum, and the like. The p-electrodes 14 are formed of Pd/Mo/Au; however, they may be formed of any other combination of materials, examples of such combinations including Pd/Pt/Au, Pd/Au, and Ni/Au.

Next, part of the n-type GaN substrate 10 is removed by polishing or etching it from the bottom surface side thereof to make the wafer roughly 80 to 200 μm thick. Thereafter, as n-electrodes 15, Hf/Al are laid in this order on the bottom surface of the n-type GaN substrate 10. The n-electrodes 15 may be formed of any other combinations of materials, examples of such combinations including Hf/Al/Mo/Au, Hf/Al/Pt/Au, Hf/Al/W/Au, Hf/Au, and Hf/Mo/Au. As variations of these materials, the Hf contained therein may be replaced with Ti or Zr. The n-electrodes 15 may be formed as discrete patches one for each nitride semiconductor laser device as shown in FIG. 1, or as a continuous layer (see FIG. 7).

The wafer, now having the nitride semiconductor growth layer 11 laid and having the ridge stripe portions 12, the p-electrodes 14, and n-electrodes 15 formed, is then cleaved, in the direction perpendicular to the <1-100> direction (see FIG. 1) in which the ridge stripe portions 12 are formed, to form cavity facets (or resonator end faces). In this way, wave-guide-type Fabry-Perot cavities (or resonators) having a cavity length of 400 μm are produced. The cavity length is not limited to 400 μm, but may be somewhere in the range from 300 μm to 1,000 μm.

Through the above-described process of cleaving the wafer and forming cavity facets, the wafer is divided into bars. Each bar has a large number of nitride semiconductor laser structures, each like the one shown in FIG. 1, formed in a horizontal row. The cavity facets thus formed correspond to the {1-100} plane of the nitride semiconductor crystal. Cleaving is achieved by drawing scribe lines over the entire bottom surface of the wafer with a diamond cutter and then applying an adequate force to the wafer. Alternatively, cleaving may be achieved by drawing scribe lines only on part of the wafer, for example only at the edges thereof, and then letting the wafer cleave starting from those partially drawn scribe lines. The cavity facets may be formed by etching.

After, in this way, two cavity facets are formed for each wave-guide-type Fabry-Perot cavity, one in front of and one behind it, on each facet of the cavity, dielectric films of $SiO_2$ and $TiO_2$ having a reflectivity of 70% are alternately vapor-deposited to form a dielectric multiple-layer reflective film. Of the two cavity facets formed, one may be used as the laser emission facet, for example, by giving the dielectric multiple-layer reflective film formed on that cavity facet a reflectivity of 5%; the other cavity facet may be used as the laser reflection facet, for example, by giving the dielectric multiple-layer reflective film formed on that cavity facet a reflectivity of 95%. These facets may be given any reflectivities other than those specifically mentioned above. The materials for the dielectric film are not limited to $SiO_2/TiO_2$; for example, $SiO_2/Al_2O_3$ may be used instead. Next, the bar having a large number of nitride semiconductor laser devices formed in a horizontal row is divided in the direction parallel to the ridge stripe portions 12 into individual nitride semiconductor laser devices (chips).

Here, the bar is placed on a stage with the bottom surface of the wafer facing upward, and is then, using an optical microscope, aligned in one scribing position after another so that scribing lines are drawn on the bottom surface of the bars with a diamond cutter. An adequate force is then applied to the bar so that the bar is divided along the scribe lines into individual nitride semiconductor laser devices (chips). This method is called the scribing method.

Chip division may be achieved by forming scratches, grooves, or the like on the bottom surface of the bar and dividing it into chips by any method other than the scribing method. Other methods for chip division include, for example: the dicing method whereby scratches are formed or cutting is performed by the use of a wire saw or thin blade; the laser scribe method whereby scribe lines are formed by producing cracks by irradiating target parts with laser light such as excimer laser and thereby heating those parts and then suddenly cooling the same parts; and the laser abrasion method whereby grooves are formed by evaporating target parts by irradiating those parts with high-energy-density laser light.

Figure 5:
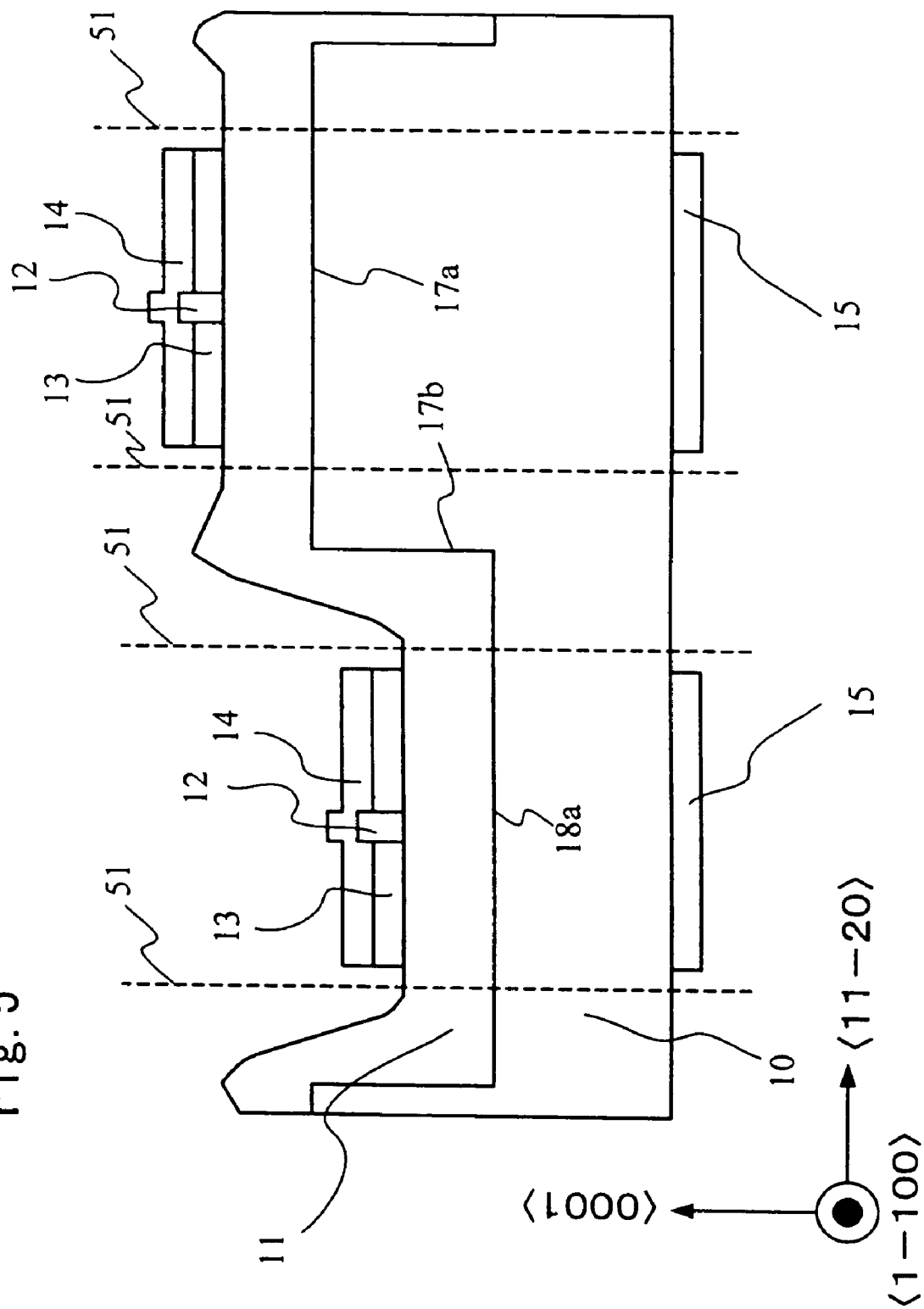
FIG. 5 is a diagram showing where chip division is performed on the wafer on which the nitride semiconductor laser device of the first embodiment of the invention is formed.
Figure 6:
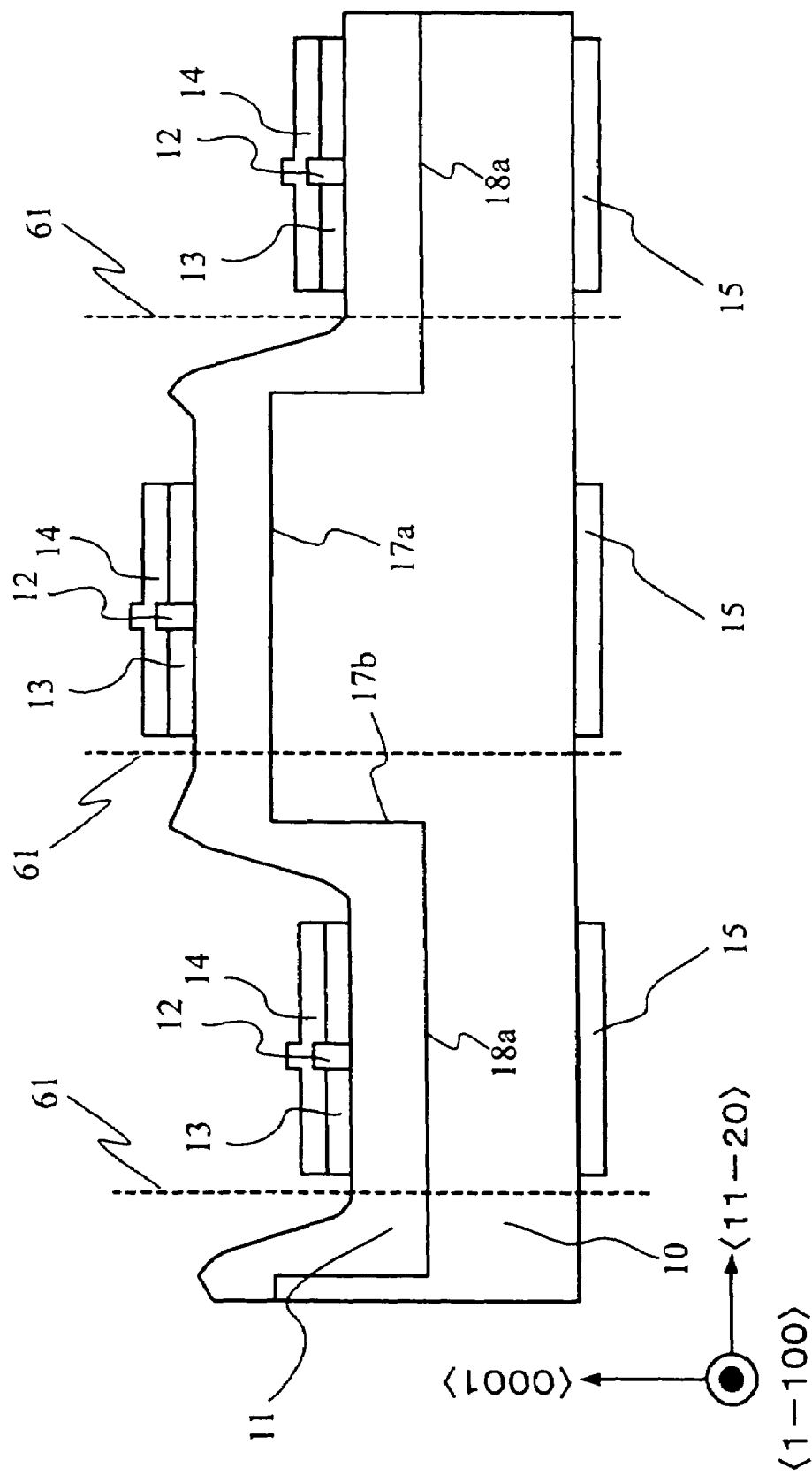
FIG. 6 is a diagram showing where chip division is performed on the wafer on which the nitride semiconductor laser device of the first embodiment of the invention is formed.

Through the chip division process described above, the nitride semiconductor laser devices formed in the flat regions at the ridges 17 and in the flat regions at the grooves 18 as shown in FIG. 1 are divided into individual chips. The divided nitride semiconductor laser devices are each 400 μm wide. In this embodiment, the ridges 17 and grooves 18 are formed at 500 μm intervals on the n-type GaN substrate 10, and, as shown in FIG. 5, cleaving is performed along division lines 51 that are 50 μm away from the side surfaces 17b of the ridges toward the center of the ridges 17 and grooves 18 to achieve division into individual nitride semiconductor laser devices. In this embodiment, division is performed so that the steps between the ridges 17 and grooves 18 are excluded. Alternatively, as shown in FIG. 6, division may be performed along division lines 61 so that the nitride semiconductor laser devices formed at the ridges 17 or the nitride semiconductor laser devices formed at the grooves 18 include those steps. The division lines may be located elsewhere than specifically described above; it is, however, preferable that they be located 20 μm or more away from the ridge stripe portions 12.

In the nitride semiconductor laser device of this embodiment produced in the manner described above, the number of cracks observed per 1 cm² area on the nitride semiconductor growth layer 11 is zero in most individual devices. In nitride semiconductor laser devices produced by conventional techniques, the number of cracks observed per 1 cm² area on the nitride semiconductor growth layer 11 is three to six. Thus, with the method used in this embodiment, it is possible to reduce the development of cracks. Moreover, it is also possible to obtain good flatness and uniformity over the entire wafer, leading to better yields.

Specifically, in nitride semiconductor laser devices produced by conventional techniques, the differences in lattice constant and in thermal expansion coefficient between different films, such as between the AlGaN clad layer and the GaN layer, included in the nitride semiconductor growth layer 11 produce strains, which in turn produce cracks. By contrast, in the nitride semiconductor laser device of this embodiment, the nitride semiconductor growth layer 11 is laid in such a way as not to fill the grooves 18 formed on the n-type GaN substrate 10. This disperses the strains present within the nitride semiconductor growth layer 11, and thereby reduces cracks. On the other hand, good flatness results from the reduced degree of unevenness of the strains within the nitride semiconductor growth layer 11.

The nitride semiconductor laser of this embodiment is assumed to be provided with a Fabry-Perot cavity; however, it may be designed as a nitride semiconductor laser adopting any other feedback method, such as a distributed feedback (DFB) laser wherein a grating is provided inside a current injection region, or a distributed Bragg reflector (DBR) laser wherein a grating is provided outside a current injection region.

Second Embodiment

Figure 7:
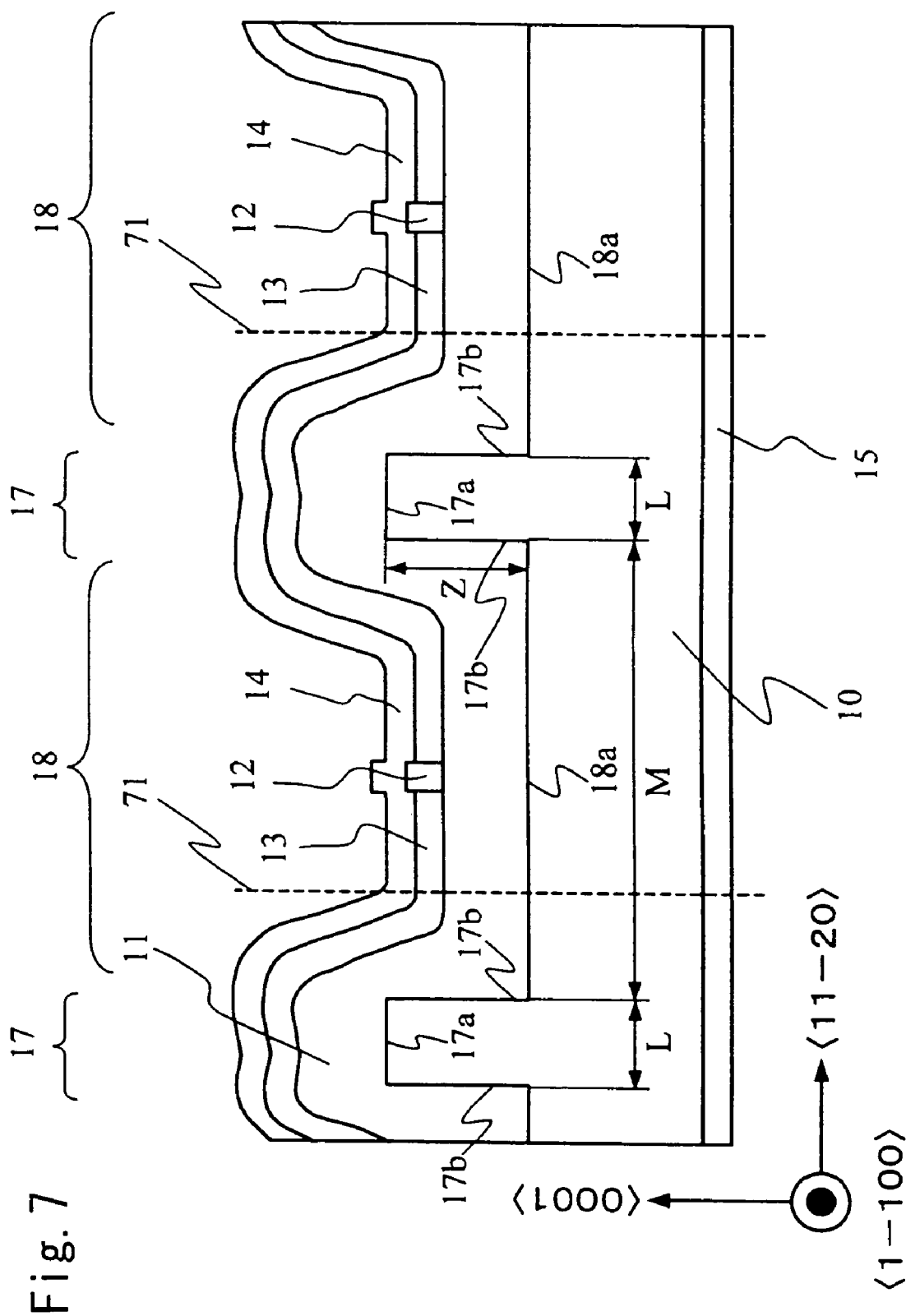
FIG. 7 is a schematic sectional view showing part of a wafer on which the nitride semiconductor laser device of the second embodiment of the invention is formed.

A second embodiment of the present invention will be described below with reference to the relevant drawings. FIG. 7 is a schematic sectional view showing part of a wafer on which the nitride semiconductor laser device of this embodiment is formed. In this embodiment, the nitride semiconductor growth layer 11 laid on top of the n-type GaN substrate 10 has the same structure as in FIG. 3 except for the layer thickness of the n-type GaN layer 21. Thus, here, the same reference numerals as used with the first embodiment are used, and, for detailed explanations that will be omitted in the description of this embodiment, the corresponding parts of the description of the first embodiment are to be referred to. Though not shown in FIG. 7, in this embodiment, the off angle of the n-type GaN substrate 10 relative to the principal plane orientation, i.e., the C plane (0001), is 0.2°.

The n-type GaN substrate 10 has grooves 18 and ridges 17 formed in a direction parallel to the <1-100> direction on an n-type GaN substrate. The width L of the ridges 17 is 50 μm, the width M of the grooves 18 is 300 μm, and the depth Z of the grooves 18 is 20 μm. How the grooves 18 and ridges 17 are formed etc. are the same as in the first embodiment, and therefore no detailed description thereof will be repeated. The cross-sectional shape of the ridges 17 and grooves 18 may be rectangular, or regular-tapered so that the width of the grooves 18 at the opening thereof is greater than the width at the floor thereof, or inverted-tapered so that the width of the grooves 18 at the opening thereof is smaller than the width at the floor thereof.

On top of the n-type GaN substrate 10 having the grooves 18 and ridges 17 formed thereon in this way, a nitride semiconductor growth layer 11 as shown in FIG. 3 is laid. In this embodiment, the n-type GaN layer 21 has a layer thickness of 2 μm. After the nitride semiconductor growth layer 11 has laid in this way, on the top surface of the wafer, the flat regions on the ridges 17 are narrow, and projections due to edge growths 19 (not illustrated) are prominent, resulting in poor flatness. On the other hand, in the grooves 18, creep-up regions 33 approximately 30 μm wide appear that run from the side surfaces 17b of the ridges toward the center of the grooves 18. Thus, in the grooves 18, flat regions approximately 240 μm wide are obtained.

Next, on the wafer produced in the manner described above, nitride semiconductor laser devices are formed. In this embodiment, the ridges are narrow, and the flat regions obtained thereon are insufficiently wide. Thus, ridge stripe portions 12 and SiO₂ layers 13 are formed in the flat regions in the grooves 18, and p-electrodes 14 are formed on top thereof. How these are formed etc. are the same as in the first embodiment, and therefore no detailed description thereof will be repeated. In this embodiment, the SiO₂ layers 13 and the p-electrodes 14 thus formed are not divided between the individual nitride semiconductor laser devices; however, as in the first embodiment, by the photolithography technique and the dry etching technique as commonly practiced, the SiO₂ layers 13 and the p-electrodes 14 may be divided and formed separately between the individual nitride semiconductor laser devices.

There are no particular restrictions on where to form the ridge stripe portions 12 except that they should be formed in flat regions on the surface of the ridges 17 and grooves 18; it is further preferable that they be located 5 μm or more away from the edges of the flat regions. In this embodiment, the ridge stripe portions 12 are formed on the top surface of the nitride semiconductor growth layer 11 laid on the surface of the ridges 17 and grooves 18, near the center of flat regions secured thereon 150 μm away from the side surfaces 17b of the ridges on both sides.

Next, part of the n-type GaN substrate 10 is removed by polishing or etching it from the bottom surface side thereof to make the wafer roughly 80 to 200 μm thick. Thereafter, n-electrodes 15 are formed on the bottom surface of the n-type GaN substrate 10. How the bottom surface of the n-type GaN substrate 10 is removed, how the n-electrodes 15 are formed, etc. are the same as in the first embodiment, and therefore no detailed description thereof will be repeated. In this embodiment, the n-electrodes 15 thus produced are not divided between the individual nitride semiconductor laser devices; however, as in the first embodiment, by the photolithography technique and the dry etching technique as commonly practiced, the n-electrodes 15 may be divided and formed separately between the individual nitride semiconductor laser devices.

The wafer, now having the nitride semiconductor growth layer 11 laid and having the ridge stripe portions 12, the p-electrodes 14, and n-electrodes 15 formed, is then cleaved, in the direction perpendicular to the <1-100> direction (see FIG. 7) in which the ridge stripe portions 12 are formed, to form cavity facets. In this way, wave-guide-type Fabry-Perot cavities having a cavity length of 600 μm are produced. The cavity length is not limited to 600 μm, but may be somewhere in the range from 300 μm to 1,000 μm. How the cavity facets are formed etc. are the same as in the first embodiment, and therefore no detailed description thereof will be repeated.

After, in this way, two cavity facets are formed for each wave-guide-type Fabry-Perot cavity, one in front of and one behind it, on each facet of the cavity, dielectric films of SiO$_2$ and TiO$_2$ having a reflectivity of 70% are alternately vapor-deposited to form a dielectric multiple-layer reflective film. Of the two cavity facets formed, one may be used as the laser emission facet, for example, by giving the dielectric multiple-layer reflective film formed on that cavity facet a reflectivity of 5%; the other cavity facet may be used as the laser reflection facet, for example, by giving the dielectric multiple-layer reflective film formed on that cavity facet a reflectivity of 95%. These facets may be given any reflectivities other than those specifically mentioned above. The materials for the dielectric film are not limited to SiO$_2$/TiO$_2$; for example, SiO$_2$/Al$_2$O$_3$ may be used instead. Next, the bar having a large number of nitride semiconductor laser structures formed in a horizontal row is divided in the direction parallel to the ridge stripe portions 12 into individual nitride semiconductor laser devices (chips). How chip division is achieved etc. are the same as in the first embodiment, and therefore no detailed description thereof will be repeated.

Through the chip division process, the nitride semiconductor laser devices formed in the flat regions at the grooves 18 as shown in FIG. 7 are divided into individual chips. The divided nitride semiconductor laser devices are each 350 wide. In this embodiment, the ridges 17 and grooves 18 are formed at 350 μm intervals on the n-type GaN substrate 10, and, as shown in FIG. 7, cleaving is performed along division lines 71 that are 40 μm away from the side surfaces 17b of the ridges toward the center of the grooves 18 to achieve division into individual nitride semiconductor laser devices. The division lines 71 may be located elsewhere than specifically described above; it is, however, preferable that they be located 20 μm or more away from the ridge stripe portions 12.

In the nitride semiconductor laser device of this embodiment produced in the manner described above, the number of cracks observed per 1 cm$^2$ area on the nitride semiconductor growth layer 11 is zero in most individual devices. In nitride semiconductor laser devices produced by conventional techniques, the number of cracks observed per 1 cm$^2$ area on the nitride semiconductor growth layer 11 is three to six. Thus, with the method used in this embodiment, it is possible to reduce the development of cracks. Moreover, it is also possible to obtain good flatness and uniformity over the entire wafer, leading to better yields.

The nitride semiconductor laser of this embodiment is assumed to be provided with a Fabry-Perot cavity; however, it may be designed as a nitride semiconductor laser adopting any other feedback method, such as a distributed feedback (DFB) laser wherein a grating is provided inside a current injection region, or a distributed Bragg reflector (DBR) laser wherein a grating is provided outside a current injection region.

Third Embodiment

Figure 8:
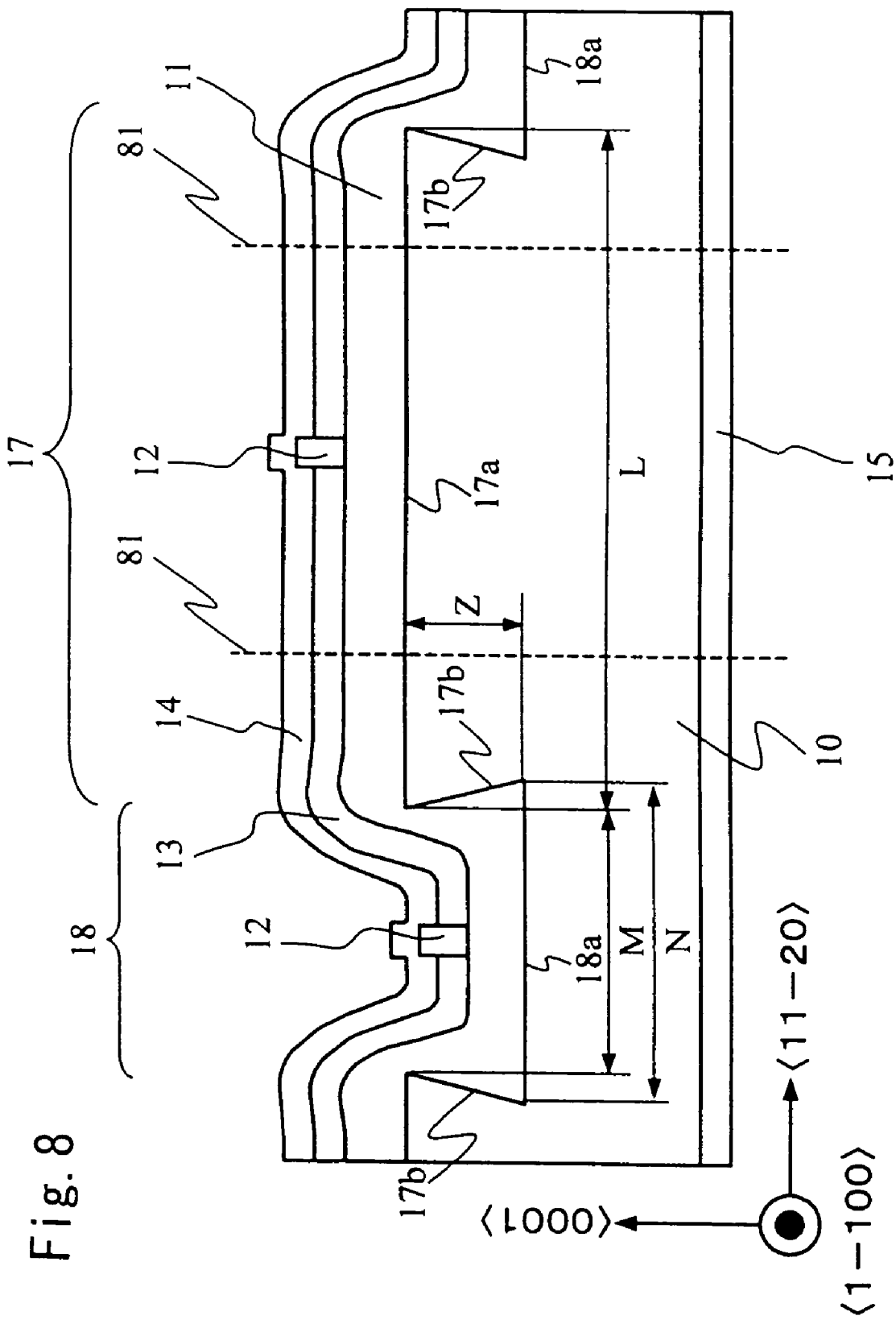
FIG. 8 is a schematic sectional view showing part of a wafer on which the nitride semiconductor laser device of the third embodiment of the invention is formed

A third embodiment of the present invention will be described below with reference to the relevant drawings. FIG. 8 is a schematic sectional view showing part of a wafer on which the nitride semiconductor laser device of this embodiment is formed. In this embodiment, the nitride semiconductor growth layer 11 laid on top of the n-type GaN substrate 10 has the same structure as in FIG. 3 except for the layer thickness of the n-type GaN layer 21. Thus, here, the same reference numerals as used with the first embodiment are used, and, for detailed explanations that will be omitted in the description of this embodiment, the corresponding parts of the description of the first embodiment are to be referred to. Though not shown in FIG. 8, in this embodiment, the off angle of the n-type GaN substrate 10 relative to the principal plane orientation, i.e., the C plane (0001), is just 0°.

In this embodiment, the n-type GaN substrate 10 has grooves 18 and ridges 17 formed in a direction parallel to the <1-100> direction on an n-type GaN substrate. The width L of the ridges 17 is 1,200 μm, the width M of the grooves 18 at the openings thereof is 50 μm, and the depth Z of the grooves 18 is 10 μm. The cross-sectional shape of the grooves 18 is inverted-tapered so that the width N of the grooves 18 at the floor 18a thereof is greater than the width M at the opening thereof.

First, in the same manner as in the first embodiment, by the photolithography technique and the dry etching technique as commonly practiced, part of the SiO$_2$ and the n-type GaN substrate 10 is removed to form grooves 18 having a rectangular cross-sectional shape as in the first embodiment. Subsequently, wet etching is performed to give the grooves 18 an inverted-tapered cross-sectional shape so that the width N of the floor surfaces 18a is grater than the width M of the openings of the grooves as shown in FIG. 8.

Here, wet etching is performed by the use of a solution of KOH (potassium hydroxide) or of NaOH (sodium hydroxide) and KOH mixed together. Heating the solution to 80° C. to 250° C. makes it possible to perform isotropic etching, which gives the grooves 18 an inverted-tapered shape.

On this n-type GaN substrate 10 having the grooves 18 formed thereon so as to have an inverted-tapered cross-sectional shape, a nitride semiconductor growth layer 11 as shown in FIG. 3 is laid. In this embodiment, the n-type GaN layer 21 is given a layer thickness of 0.1 μm.

In this embodiment, the width M of the openings of the grooves 18 is 50 μm, i.e., smaller than the width N of the floor surfaces of the grooves 18, giving the grooves 18 an inverted-tapered cross-sectional shape. This restrains creep-up growth, and prevents the grooves 18 from being filled. Thus, after the nitride semiconductor growth layer 11 is laid, flat regions approximately 10 μm wide are obtained roughly at the center of the grooves 18, and flat regions 1,140 μm to 1,150 μm wide are obtained on the ridges 17. Roughly in middle portions of the flat regions in the grooves 18 and in middle portions of the flat regions on the ridges 17, ridge stripe portions 12, SiO$_2$ layers 13, and p-electrodes 14 are formed. How these are formed etc. are the same as in the first embodiment, and therefore they are identified with common reference numerals and symbols, and their detailed explanations will not be repeated. In this embodiment, the SiO$_2$ layers 13 and the p-electrodes 14 thus formed are not divided between the individual nitride semiconductor laser devices; however, as in the first embodiment, by the photolithography technique and the dry etching technique as commonly practiced, the SiO$_2$ layers 13 and the p-electrodes 14 may be divided and formed separately between the individual nitride semiconductor laser devices.

There are no particular restrictions on where to form the ridge stripe portions 12 except that they should be formed in flat regions on the surface of the ridges 17 and grooves 18; it is further preferable that they be located 5 μm or more away from the edges of the flat regions.

Next, part of the n-type GaN substrate 10 is removed by polishing or etching it from the bottom surface side thereof to make the wafer roughly 80 to 200 μm thick. Thereafter, n-electrodes 15 are formed on the bottom surface of the n-type GaN substrate 10. How the bottom surface of the n-type GaN substrate 10 is removed, how the n-electrodes 15 are formed, etc. are the same as in the first embodiment, and therefore no detailed description thereof will be repeated. In this embodiment, the n-electrodes 15 thus produced are not divided between the individual nitride semiconductor laser devices; however, as in the first embodiment, by the photolithography technique and the dry etching technique as commonly practiced, the n-electrodes 15 may be divided and formed separately between the individual nitride semiconductor laser devices.

The wafer, now having the nitride semiconductor growth layer 11 laid and having the ridge stripe portions 12, the p-electrodes 14, and n-electrodes 15 formed, is then cleaved, in the direction perpendicular to the <1-100> direction in which the ridge stripe portions 12 are formed, to form cavity facets. In this embodiment, wave-guide-type Fabry-Perot cavities having a cavity length of 400 μm are produced. The cavity length is not limited to 400 μm, but may be somewhere in the range from 300 μm to 1,000 μm. How the cavity facets are formed etc. are the same as in the first embodiment, and therefore no detailed description thereof will be repeated.

After, in this way, two cavity facets are formed for each wave-guide-type Fabry-Perot cavity, one in front of and one behind it, on each facet of the cavity, dielectric films of $SiO_2$ and $TiO_2$ having a reflectivity of 70% are alternately vapor-deposited to form a dielectric multiple-layer reflective film. Of the two cavity facets formed, one may be used as the laser emission facet, for example, by giving the dielectric multiple-layer reflective film formed on that cavity facet a reflectivity of 5%; the other cavity facet may be used as the laser reflection facet, for example, by giving the dielectric multiple-layer reflective film formed on that cavity facet a reflectivity of 95%. These facets may be given any reflectivities other than those specifically mentioned above. The materials for the dielectric film are not limited to $SiO_2/TiO_2$; for example, $SiO_2/Al_2O_3$ may be used instead. Next, the bar having a large number of nitride semiconductor laser structures formed in a horizontal row is divided in the direction parallel to the ridge stripe portions 12 into individual nitride semiconductor laser devices (chips). How chip division is achieved etc. are the same as in the first embodiment, and therefore no detailed description thereof will be repeated.

Through the chip division process, the nitride semiconductor laser devices formed in the flat regions at the ridges 17 and in the flat regions at the grooves 18 as shown in FIG. 8 are divided into individual chips. In this embodiment, the width M of the openings of the grooves 18 is as small as 50 μm. Thus, cleaving is performed, for example, along division lines 81 at the ridges 17. In this case, as in the second embodiment, it is preferable that cleaving be performed 20 μm or more away from the ridge stripe portions 12.

In the nitride semiconductor laser device of this embodiment produced in the manner described above, the number of cracks observed per 1 $cm^2$ area on the nitride semiconductor growth layer 11 is zero in most individual devices. In nitride semiconductor laser devices produced by conventional techniques, the number of cracks observed per 1 $cm^2$ area on the nitride semiconductor growth layer 11 is three to six. Thus, with the method used in this embodiment, it is possible to reduce the development of cracks. Moreover, it is also possible to obtain good flatness and uniformity over the entire wafer, leading to better yields.

The nitride semiconductor laser of this embodiment is assumed to be provided with a Fabry-Perot cavity; however, it may be designed as a nitride semiconductor laser adopting any other feedback method, such as a distributed feedback (DFB) laser wherein a grating is provided inside a current injection region, or a distributed Bragg reflector (DBR) laser wherein a grating is provided outside a current injection region.

Nitride semiconductor light-emitting devices according to the present invention can be used as laser diodes, and can suitably be used in optical pickups that are used in optical disk apparatuses such as DVD drives to produce blue laser.

What is claimed is:

1. A method for fabricating a nitride semiconductor light-emitting device, the device including:
    a nitride semiconductor substrate having a groove and a ridge formed on a top surface thereof so as to extend in a shape of stripes; and
    a nitride semiconductor growth layer having a plurality of nitride semiconductor layers laid on top of the nitride semiconductor substrate,
the method comprising:
    a first step of forming a 10 μm or more wide flat region above at least either of the groove and ridge by forming the nitride semiconductor growth layer on top of the nitride semiconductor substrate so that a height of the nitride semiconductor growth layer laid above the groove is smaller than a height of the nitride semiconductor growth layer laid above the ridge;
    wherein semiconductor growth layer is an n-type GaN layer formed on the surface of the nitride semiconductor substrate, wherein the n-GaN layer thickness is 0.1 μm or more but 2 μm or less and an off angle of the top surface of the nitride semiconductor substrate is 0.2° or less
    a second step of forming an elevated ridge stripe portion on the surface of the nitride semiconductor growth layer in the flat region formed in the first step; and
    a third step of performing division along at least either of the groove and ridge along a division line extending in a direction parallel to the ridge stripe portion,
    wherein a layer thickness of an n-type GaN layer laid on the surface of the nitride semiconductor substrate is 0.1 μm or more but 2 μm or less.

2. The method of claim 1,
    wherein a cross-sectional shape of the groove is rectangular, or inverted-tapered so that a width of the groove at an opening thereof is smaller than a width of the groove at a floor thereof, or regular-tapered so that the width of the groove at the opening thereof is greater than the width of the groove at the floor thereof.

3. The method of claim 1,
    wherein a width of the groove formed on the nitride semiconductor substrate is 50 μm or more but 1,200 μm or less.

4. The method of claim 1,
    wherein a depth of the groove formed on the nitride semiconductor substrate is 3 μm or more but 20 μm or less.

5. The method of claim 1,
wherein a width of the ridge is 70 μm or more but 1,200 μm or less.

6. The method of claim 1,
wherein the ridge stripe portion is formed in the flat region, 5 μm or more away from an edge of the flat region.

7. The method of claim 1,
wherein, in the third step, the division line is at least 20 μm away from the ridge stripe portion.

8. The method of claim 1,
wherein, in the third step, the nitride semiconductor light-emitting device formed above the groove or ridge is divided along the division line so that the nitride semiconductor light-emitting device thus divided does not include a stepped portion formed between the groove and the ridge.

9. The method of claim 1,
wherein, in the third step, the nitride semiconductor light-emitting device formed above the groove or ridge is divided along the division line so that the nitride semiconductor light-emitting device thus divided includes a stepped portion formed between the groove and the ridge.

10. The method of claim 1,
wherein, when the nitride semiconductor light-emitting device is formed above both the groove and ridge, the nitride semiconductor light-emitting device formed above the groove and ridge is divided so that one of the nitride semiconductor light-emitting devices thus divided includes a stepped portion formed between the groove and the ridge.

* * * * *

UNITED STATES PATENT AND TRADEMARK OFFICE
CERTIFICATE OF CORRECTION

| | | |
|---|---|---|
| PATENT NO. | : 7,109,049 B2 | Page 1 of 1 |
| APPLICATION NO. | : 11/060381 | |
| DATED | : September 19, 2006 | |
| INVENTOR(S) | : Teruyoshi Takakura et al. | |

It is certified that error appears in the above-identified patent and that said Letters Patent is hereby corrected as shown below:

In the claims:

Column 18, lines 37-42 , delete "wherein semiconductor growth layer is an n-type GaN layer formed on the surface of the nitride semiconductor substrate, wherein the n-GaN layer thickness is 0.1 µm or more but 2 µm or less and an off angle of the top surface of the nitride semiconductor substrate is $0.2^0$ or less"

Signed and Sealed this

Twentieth Day of February, 2007

JON W. DUDAS
*Director of the United States Patent and Trademark Office*